(12) United States Patent
Banzhaf et al.

(10) Patent No.: US 10,460,931 B2
(45) Date of Patent: Oct. 29, 2019

(54) SEMICONDUCTOR TRANSISTOR HAVING SUPERLATTICE STRUCTURES

(71) Applicant: Robert Bosch GmbH, Stuttgart (DE)

(72) Inventors: Christian Tobias Banzhaf, Laichingen (DE); Martin Rambach, Pliezhausen (DE); Michael Grieb, Renningen-Malmsheim (DE); Thomas Jacke, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/060,612

(22) PCT Filed: Oct. 19, 2016

(86) PCT No.: PCT/EP2016/075034
§ 371 (c)(1),
(2) Date: Jun. 8, 2018

(87) PCT Pub. No.: WO2017/097482
PCT Pub. Date: Jun. 15, 2017

(65) Prior Publication Data
US 2018/0374698 A1    Dec. 27, 2018

(30) Foreign Application Priority Data

Dec. 11, 2015    (DE) .................. 10 2015 224 965

(51) Int. Cl.
*H01L 21/02*    (2006.01)
*H01L 29/78*    (2006.01)
(Continued)

(52) U.S. Cl.
CPC .... *H01L 21/02507* (2013.01); *H01L 29/0623* (2013.01); *H01L 29/0696* (2013.01);
(Continued)

(58) Field of Classification Search
CPC .......... H01L 21/02507; H01L 29/4236; H01L 29/7805; H01L 29/0623; H01L 29/7813; H01L 29/0696
(Continued)

(56) References Cited

U.S. PATENT DOCUMENTS 6,049,108 A    4/2000    Williams et al.
2005/0167695 A1    8/2005    Yilmaz
(Continued)

FOREIGN PATENT DOCUMENTS

DE    112004002608 T5    11/2006
DE    112011104322 T5    10/2013
(Continued)

OTHER PUBLICATIONS

Takaye et al., "Proceedings of the 19th International Symposium on Power Semiconductor Devices and ICS", p. 197-200, (2007).
(Continued)

*Primary Examiner* — Caleen O Sullivan
(74) *Attorney, Agent, or Firm* — Norton Rose Fulbright US LLP; Gerard Messina

(57) ABSTRACT

A transistor, including a substrate of a first doping type; an epitaxy layer of the first doping type above the substrate; a channel layer of a second doping type, differing from the first doping type, above the epitaxy layer; a plurality of trenches in the channel layer, which have a gate electrode situated below the trenches and are bordered by a source terminal of the first doping type above the channel layer; a plurality of shielding areas of the second doping type, which are situated below the gate electrode. The shielding areas are guided below the trenches together in a interconnection of shielding areas, and several shielding areas are jointly guided to terminals for contacting the shielding areas.

11 Claims, 4 Drawing Sheets

(51) Int. Cl.
*H01L 29/423* (2006.01)
*H01L 29/06* (2006.01)

(52) U.S. Cl.
CPC ...... *H01L 29/4236* (2013.01); *H01L 29/7805* (2013.01); *H01L 29/7813* (2013.01)

(58) Field of Classification Search
USPC .......................................... 257/192, 330, 77
See application file for complete search history.

(56) References Cited

U.S. PATENT DOCUMENTS

| | | |
|---|---|---|
| 2009/0152667 A1 | 6/2009 | Rieger et al. |
| 2011/0121316 A1 | 5/2011 | Harada |
| 2013/0270576 A1 | 10/2013 | Masuda et al. |
| 2013/0285140 A1* | 10/2013 | Kagawa ............ H01L 29/7811 257/330 |
| 2013/0328122 A1 | 12/2013 | Li et al. |
| 2014/0159053 A1 | 6/2014 | Chen et al. |
| 2014/0319606 A1 | 10/2014 | Bhalla et al. |
| 2015/0129895 A1* | 5/2015 | Takeuchi ............ H01L 29/4236 257/77 |
| 2016/0181372 A1* | 6/2016 | Wada ................. H01L 29/1095 257/77 |

FOREIGN PATENT DOCUMENTS

| | | |
|---|---|---|
| EP | 2091083 A2 | 8/2009 |
| EP | 2863417 A1 | 4/2015 |
| WO | 2015012009 A1 | 1/2015 |

OTHER PUBLICATIONS

Nakamura et al., "International Electron Devices Meeting", p. 26.5.1-26.5.3, (2011). 2011 IEEE.

International Search Report for PCT/EP2016/075034, dated Dec. 6, 2016.

* cited by examiner

SEMICONDUCTOR TRANSISTOR HAVING SUPERLATTICE STRUCTURES

FIELD

The present invention relates to a transistor, which has a plurality of trenches, in which the gate electrode is situated, and which has interconnected shielding areas to prevent high electric fields.

BACKGROUND INFORMATION

Conventional power transistors are produced by connecting individual cells in parallel in the cell field. These individual cells are all identical in order to ensure reliable parallel operation. Currently, partially modified cell structures are used only in the edge area of the transistor, that is, between the cell field and the edge structure or between the cell field and the gate terminal/gate runner. The number of conductive individual cells for a power transistor is currently several thousand.

Frequently, trench MOSFETs are used for this purpose, which typically have low forward resistances and therefore low forward power losses. Trench MOSFETs have a gate electrode within the trenches, which is insulated from the surroundings by a gate insulator, usually a gate oxide. In trench MOSFETs it is necessary to ensure that the electric field intensity on the gate oxide remains within certain limits since otherwise undesired leakage currents or even the destruction of the gate oxide result.

To ensure reliable operation, approaches have been found that aim to reduce the electric field near the trenches by p-doped or effectively p-doped areas (in an npn layer sequence), for example by so-called p bubbles. In Takaye et al., Proceedings of the 19th International Symposium on Power Semiconductor Devices & ICs, p. 197-200 (2007), such p-type areas are introduced for a silicon-based trench MOSFET below the gate trenches, but are designed to be floating, that is, the p-type areas have no defined voltage potential. Nakamura et al., 2011 IEEE International Electron Devices Meeting, p. 26.5.1-26.5.3 (2011) describes a trench MOSFET based on silicon carbide (SiC), in which the p-type areas for field shielding are situated next to the trench and, in contrast to Takaya et al., Proceedings of the 19th International Symposium on Power Semiconductor Devices & ICs, p. 197-200 (2007), are connected to the source potential by a metallic coating. This connection is necessary for components based on silicon carbide (SiC) since otherwise, due to the minority carrier concentration being lower in comparison to silicon (Si) by orders of magnitude, a recharging of such p-type areas following their depletion takes very long and thus the switching behavior is markedly deteriorated. Another possibility for implementing a SiC trench MOSFET is described in European Patent No. EP2091083A2 (FIG. 1). In this instance, the p-type areas for field shielding are run orthogonally with respect to the trench lines. The contact is established directly on each trench, as in Takaya et al., Proceedings of the 19th International Symposium on Power Semiconductor Devices & ICs, p. 197-200 (2007). Another variant is described in U.S. Patent Application No. 2011/0121316 A1 for example (FIG. 1). In this instance, the p-type areas for shielding the electric field lie next to the gate trenches like in Takaya et al., Proceedings of the 19th International Symposium on Power Semiconductor Devices & ICs, p. 197-200 (2007). These p-type areas are likewise contacted in each cell.

The above-mentioned specific conventional embodiments all have in common that the contacted p-type areas for shielding the electric field lie completely or partially next to the gate trench. The contacts of the p-type areas are in these cases always established in situ. This creates an additional surface area requirement for the cell structure, which does not entail any additional increase in channel width. This increases the pitch measure of the transistor. The necessary surface area requirement for these p-type areas and for contacting the p-type areas in each individual cell adds up in accordance with the number of cells (several thousand per transistor).

SUMMARY

The present invention provides an example transistor, comprising a substrate of a first doping type, an epitaxy layer of the first doping type above the substrate, a channel layer of a second doping type, differing from the first doping type, above the epitaxy layer, a plurality of trenches in the channel layer, which have a gate electrode situated within the trenches and are bordered by a source terminal of the first doping type above the channel layer, a plurality of shielding areas of the second doping type, which are situated below the gate electrode. According to the example embodiment of the present invention, the shielding areas together form an interconnection of shielding areas below the trenches, and several shielding areas are jointly guided to terminals for contacting the shielding areas. The term "multiple shielding areas," which are jointly guided to terminals, comprises more than two shielding areas, preferably more than four shielding areas, even more preferably more than eight shielding areas. The present invention may have the advantage that the channel width per surface area is markedly increased, that is, the current carrying capacity of the transistor increases with the same available surface area, since due to the interconnection of shielding areas the contact surface area no longer increases multiplied by the number of cells, but rather only multiplied by the number of contact points guided to the surface, the number of contact points guided to the surface being according to the present invention always smaller than the number of cells due to the interconnection of shielding areas and their joint guidance to the terminals. This reduces the pitch measure of the transistor accordingly. The resulting surface area reduction additionally achieves a reduction in costs since the costs per surface area are approximately constant. Another important feature results from the fact that contacting the shielding areas for shielding the electric field is made possible at the level of the trenches, which makes it possible to achieve higher switching rates of the transistor. Furthermore, no high-energy implantation is necessary for producing this transistor. Since it is possible to avoid a double trench design in this instance, as is often conventionally used, technological expenditures are reduced, for removing material remnants for example such as gate material or insulation material from the trenches. Moreover, additional steps and edges in the cell field are avoided, which improves reproducibility while reducing the adjustment precision and the technical requirements of lithography compared to a double trench design.

It is advantageously possible to situate the shielding areas directly below the trenches. This has the advantage that the lateral space requirement is kept as small as possible, that is, little additional surface area is required.

The shielding areas may be embedded within the trenches as the lowest layer and be insulated from the gate electrode by a first insulating layer. This advantageously implies a particularly efficient and simple production process.

Preferably, a grid may be made up of first cells, which are formed from the channel terminal of the second doping type for contacting the channel layer and a source terminal bordering the channel terminal, the first cells being bordered by trenches, the grid having gaps into which second cells are inserted, which have the terminals for the shielding areas for contacting the interconnection of shielding areas.

In a particular specific embodiment, the second cells themselves may form a grid within the grid of the first cells. Such a structure represents a superlattice. A regular structure of the cell field is advantageous especially in the production process and furthermore stabilizes the operation. Here too, the size of the first cells and of the second cells may be variable and may be adapted to the requirement of current carrying capacity.

The second cells may have a diode terminal that is short-circuited with the source, whereby an integrated diode connected in parallel is provided. For many switching applications such a diode is advantageously required. The surface area for the terminal of the integrated diode may be adjusted variably in combination with the current carrying capacity to be achieved.

Advantageously, the number of the second cells may be smaller than the number of the first cells and/or the number of the terminals of the shielding areas may be smaller than the number of channel terminals. The gain in surface area increases as a result since the current carrying capacity is achieved or obtained via the first cells.

The second cells may have a greater surface area than the first cells. This has the advantage that the surface area for the diode terminal may be developed to be greater.

The share of surface area of the second cells may be less than 30%, preferably less than 10% of the total surface area of the transistor. This especially ensures an increased current carrying capacity vis-a-vis the conventional methods of the related art.

Advantageously, the second cells and/or the first cells may be designed to be triangular, rectangular, square, pentagonal, hexagonal, round or linear.

The transistor is preferably a trench MOSFET transistor.

BRIEF DESCRIPTION OF THE DRAWINGS

Exemplary embodiments of the present invention are explained in greater detail with reference to the figures and the description below.

DETAILED DESCRIPTION OF EXAMPLE EMBODIMENTS

Figure 1:
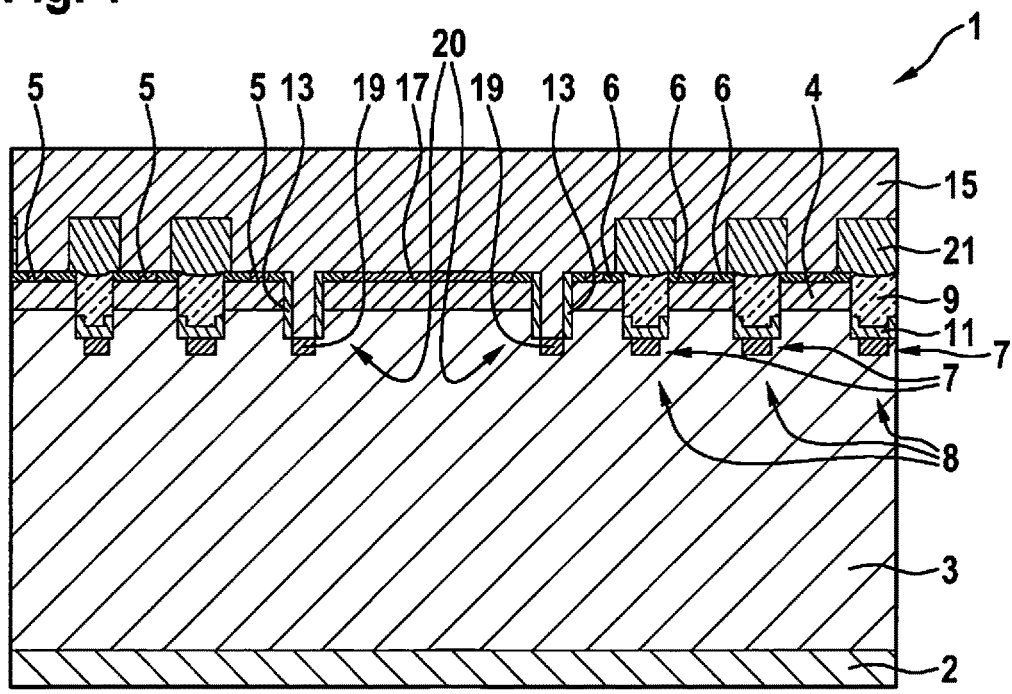
FIG. 1 shows a transistor of the present invention as a lateral view according to a first exemplary embodiment.

FIG. 1 shows a transistor 1 according to the present invention, by way of example a trench MOSFET transistor 1, as a lateral view according to a first exemplary embodiment. Transistor 1 shows a layer sequence of a semiconductor material, preferably of silicon carbide (SiC). The lowest layer is formed by a substrate 2 of a first doping type, which typically functions as a drain terminal (metallic contact not drawn). It is followed by an epitaxy layer 3 of the first doping type and a channel layer 4, situated above this epitaxy layer 3, of a second doping type that differs from the first doping type. Furthermore, a plurality of trenches 8 is inserted through channel layer 4 into epitaxy layer 3. In these trenches 8 there is a gate electrode 9, which may be contacted separately. Gate electrode 9 is covered by a gate insulator (not drawn), which electrically insulates gate electrode 9 from the surroundings. An oxide is typically used as gate insulator. Typically, polysilicon is used as gate material, it alternatively also being possible to use metals such as aluminum for example. Above channel layer 4, there is a source terminal 6 of the first doping type, which borders each trench 8. Shielding area 7 of the second doping type are situated below trenches 8, which shield the gate insulator against excessively high electrical fields. According to the present invention, these shielding areas 7 form an interconnection 30 of the shielding areas below trenches 8, preferably designed as a two-dimensional network structure (not visible in this view, visible in FIG. 2 in a top view), the present invention not being limited to a two-dimensional connection system. FIG. 1 furthermore shows terminals 19 for the shielding areas of the second doping type jointly guided to the surface, in accordance with the present invention. According to the present invention, these terminals 19 for the shielding areas are consequently not implemented on each trench 8, but only in certain locations, which is made possible by the inventive interconnection 30 of the shielding areas below trenches 8. Terminals 19 for the shielding areas are implemented in exemplary fashion within narrow trenches 20, are laterally insulated by a second insulating layer 13 against channel layer 4 and epitaxy layer 3 and are connected to source terminal 6 via a metal 15. For this purpose, trenches 20 are designed to be of such a depth that the terminal 19 of the shielding areas is at the same level as the shielding areas 7 below trenches 8. By reducing the terminals 19 for the shielding areas in accordance with the present invention, the surface area requirement is advantageously reduced, which results in a reduction of the pitch measure and increases the current carrying capacity of transistor 1, while maintaining an identical surface area with respect to the related art. The shielding areas 7 may be implemented as so-called bubbles of the second doping type, for example, or alternatively also by an effective compensation layer of the second doping type, made up of periodically arranged alternating areas of the first and second doping types. It is not necessary for shielding area 7 to be positioned directly below trench 8, but rather it may alternatively be offset or may be situated so as to encase the lower part of trench 8 for example. The shape of shielding area 7 below trenches 8 may also be variable, for example round or ellipsoidal. It is possible for an additional thickening first insulating layer 11 to be introduced between shielding areas 8 and gate electrode 9 in order to insulate gate electrode 9 in reinforced fashion.

Channel terminals 5 of the second doping type are bordered by source terminals 6, which are used to contact channel layer 4. The contact is connected to source terminal 6 via metal 15. A third insulating layer 21 is situated above gate electrode 9, which insulates gate electrode 9 completely from metal 15. In this specific embodiment, a diode terminal 17 of the second doping type for terminals 19 for the shielding areas is here implemented by way of example between two trenches 20. Diode terminal 17 is here connected accordingly to source terminal 6 via metal 15 and thus provides an integrated diode, which is connected in parallel and which may be used advantageously for the most varied switching applications.

Transistor 1 functions according to the usual standard and is added here only for further understanding. In the event of a positive (negative) voltage on gate electrode 9 in an npn layer sequence (pnp), which is greater than a threshold voltage, a thin continuous channel (inversion channel) is produced in channel layer 4 along the lateral walls of trenches 8, which extends into epitaxy layer 3 and forms a conductive connection between substrate 2 and source terminal 6. It is then possible for current to flow along these channels if a voltage is accordingly applied between drain and source. Further information is found in the relevant technical literature.

Figure 2:
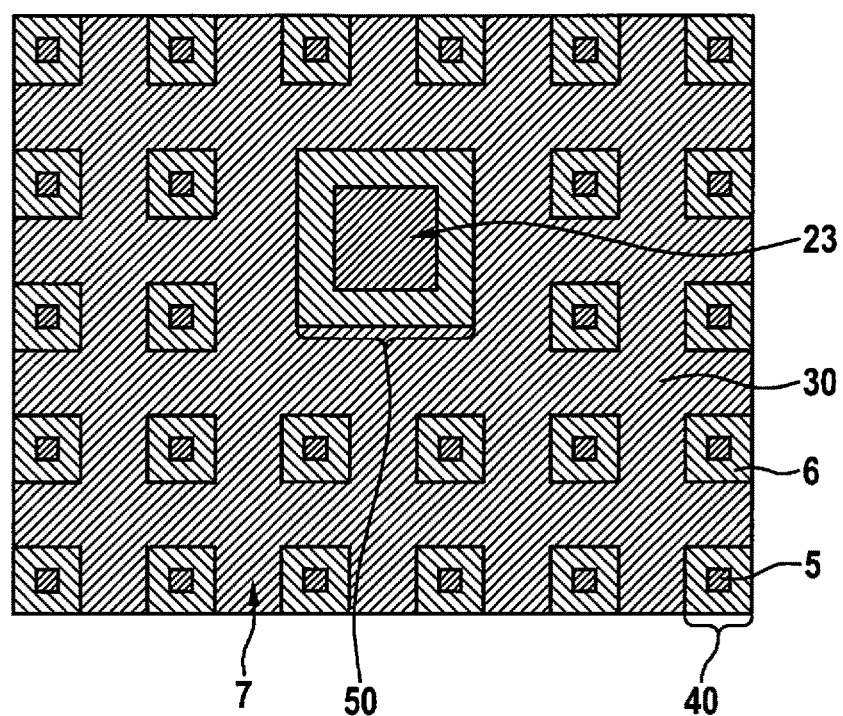
FIG. 2 shows a cell field with a visible interconnection of the shielding areas with superlattice structure as a top view.

FIG. 2 shows a section through transistor 1, in which the embedded shielding areas 7 are visible. A cell-like structure may be seen. A first cell 40 is made up, by way of example, of channel terminal 5 of the second doping type as well as adjacent source terminal 6. These first cells 40 are separated from one another by shielding areas 7 of the electric field from trench 8, which form an inventive interconnection 30 of the shielding areas, a regular network in this exemplary case, the present invention not being limited to a regular structural interconnection. First cells 40 are designed to be square, by way of example, but they may also be rectangular, triangular, pentagonal, hexagonal, round, linear, etc. First cells 40 form here, by way of example, a grid between interconnection 30 of the shielding areas. In this figure, this grid has a gap into which a second cell 50 is inserted. Second cell 50 is made up a common terminal 23 both for shielding areas 7 and for the diode that is connected in parallel. As in FIG. 1, these contacts may also be implemented separately. This contact is appropriately connected (not visible from this perspective) to interconnection 30 of the shielding areas. The interconnection 30 of the shielding areas located below trenches 8 is guided to the surface for contacting only on second cells 50, in accordance with the present invention. This saves surface area accordingly, since the lateral space requirement is reduced, and increases the current carrying capacity per surface area.

Figure 3:
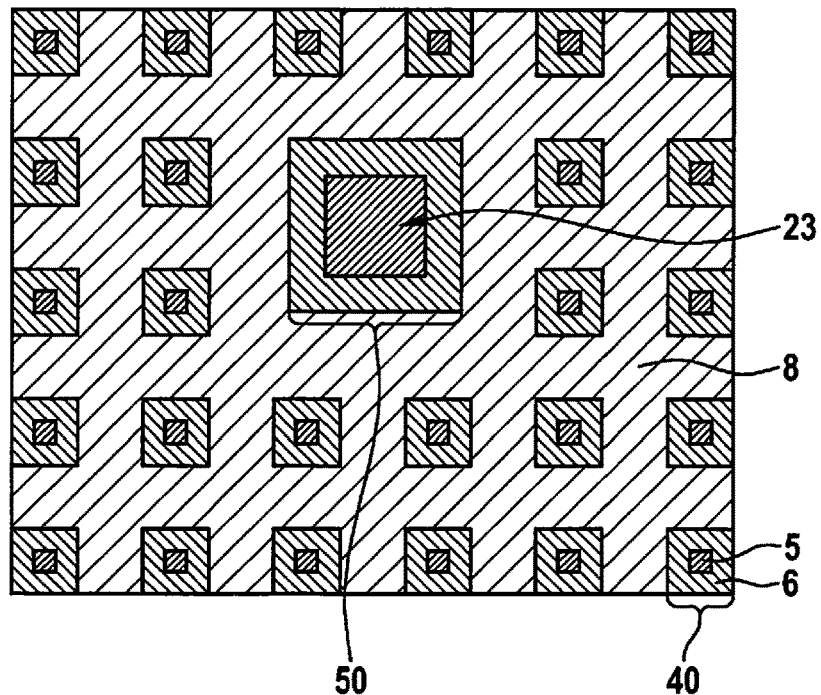
FIG. 3 shows a cell field with unfilled trenches as a top view.

FIG. 3 shows a section through transistor 1, in the preparation step when trenches 8 are not yet filled. Trenches 8 here form an interconnected network, into which shielding areas 7 may be inserted as the lowest layer, as shown in FIG. 2. The present invention, however, also includes the case in which trenches 8 are not interconnected and thus themselves form the first cells 40 of the cell field.

Figure 4:
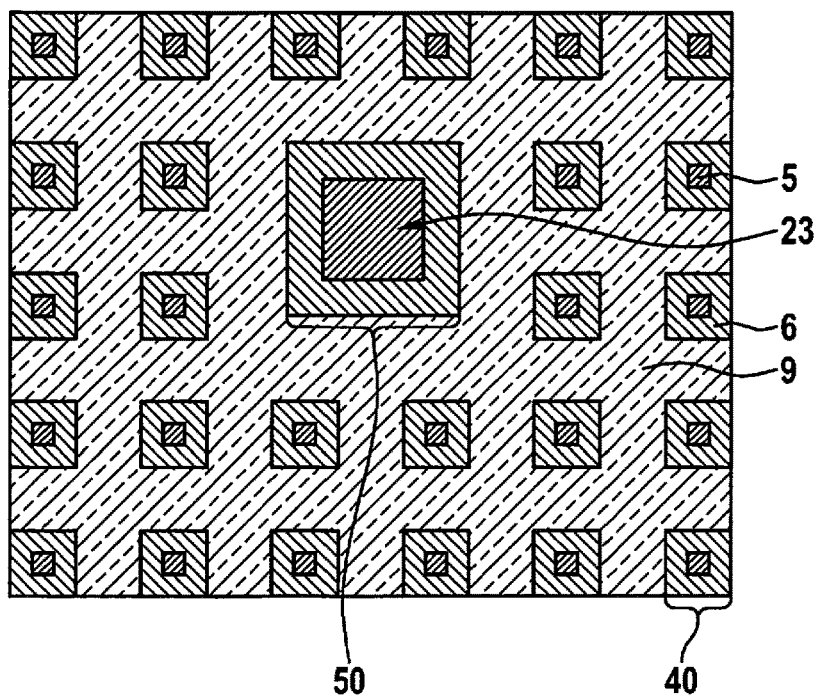
FIG. 4 shows a cell field with inserted gate electrodes as a top view.

Like FIGS. 2 and 3, FIG. 4 also shows the cell field, gate electrodes 9 having been inserted, which are located above interconnection 30 of the shielding areas. Second cells 50 have, by way of example, a common terminal 23 both for shielding areas 7 and for the diode that is connected in parallel.

Figure 5:
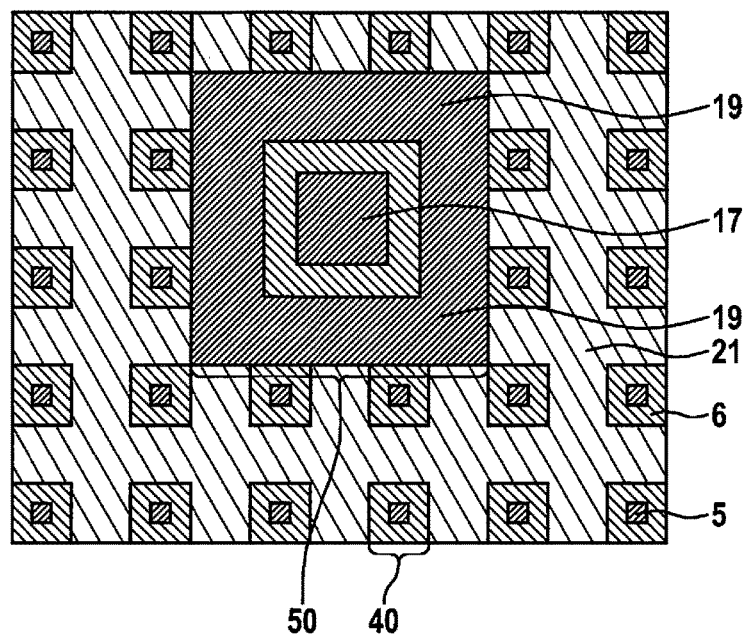
FIG. 5 shows a cell field with inserted first insulation layer as a top view.

FIG. 5 shows a cell field, in which a third insulating layer 21 is applied above gate electrode 9, which insulates gate electrode 9 from the surroundings. Furthermore, a terminal 19 for the shielding areas is integrated in second cell 50, here implemented on the edge of second cell 50 by way of example, as well as diode terminal 17, here implemented in the interior of second cell 50 by way of example.

Figure 6:
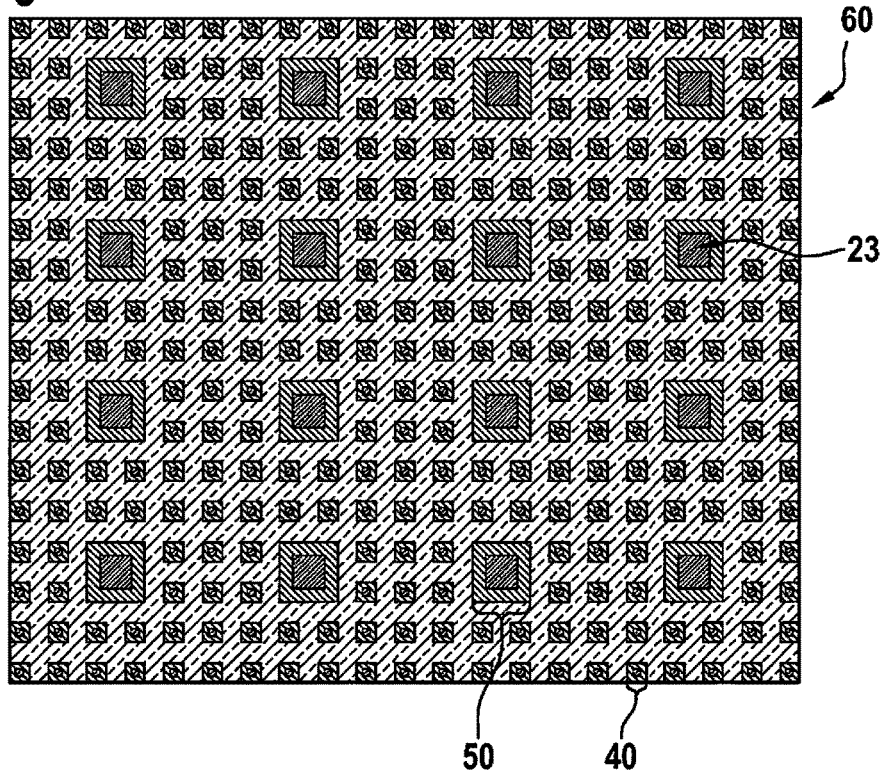
FIG. 6 shows a superlattice structure.

FIG. 6 shows a cell field of a transistor 1 having multiple second cells 50. The totality of first cells 40 forms a grid, which has gaps, into which the second cells 50 are inserted. Second cells 50 themselves form a grid, a superlattice 60. These have, by way of example, a common terminal 23 both for shielding areas 7 and for the diode. The present invention, however, is not limited to a superlattice 60. It is possible, for example, for second cells 50 to be distributed in a disordered manner in the cell field of first cells 40, or only one single second cell 50 is responsible as contact for the integrated diode connected in parallel or as terminal 19 for shielding areas 7. The cells are here designed as squares, by way of example. The present invention is not limited to this type of cells, however, but rather triangles, rectangles, pentagons, hexagons, etc. may be used as well. It is likewise possible for the arrangement of second cells 50 and/or first cells 40 to have a different structure than the square grid structure implemented in this case, that is, for example rectangular, triangular, pentagonal, hexagonal, etc. It is also not necessary for the grid types of first cells 40 and second cells 50 to be identical. The square structure selected in the exemplary embodiment has the advantage of allowing for a particularly simple and speedy production process.

Figure 7:
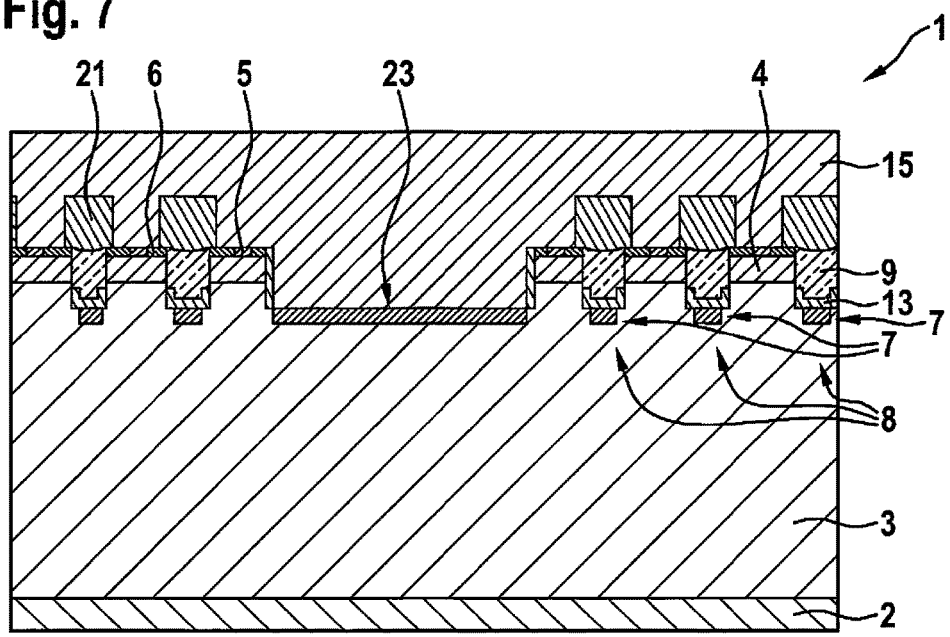
FIG. 7 shows a transistor of the present invention as a lateral view according to a second exemplary embodiment.

FIG. 7 shows another specific embodiment of the transistor 1 of the present invention as a lateral view similar to FIG. 1. Unlike in FIG. 1, here diode terminal 17 is combined with terminal 19 for the shielding areas to form a common terminal 23 and lowered together. The depth of these terminals here corresponds to the depth of shielding areas 7, by way of example.

The present invention has the advantage that a higher current carrying capacity is ensured for the same surface area, which achieves a reduction of the terminals for the shielding areas 19. The present invention includes the interconnection 30 of the shielding areas below the trenches, as a result of which it is no longer necessary to guide a contact point to the surface at every trench. Furthermore, in a certain specific embodiment, regular cell structures are provided having both a grid made up of first cells 40 as well as a superimposed grid made up of second cells 50, which have the advantage of being simple to produce as well as being stable in operation.

Although the present invention was illustrated and described in detail by preferred exemplary embodiments, the present invention is not limited by the disclosed examples, and one skilled in the art is able to derive other variations from this without leaving the scope of the present invention.

What is claimed is:
1. A transistor, comprising:
a substrate of a first doping type;
an epitaxy layer of the first doping type above the substrate;
a channel layer of a second doping type, which differs from the first doping type, above the epitaxy layer;
a plurality of trenches in the channel layer, which have a gate electrode situated within the trenches and are bordered by a source terminal of the first doping type above the channel layer;
a plurality of shielding areas of the second doping type situated below the gate electrode;
wherein the shielding areas form together an interconnection of shielding areas below the trenches and several of the shielding areas are jointly guided to terminals for contacting the shielding areas,
wherein a grid is made up of first cells, which are formed from the channel terminal of the second doping type for contacting the channel layer and a source terminal bordering the channel terminal, the first cells being bordered by trenches, the grid having gaps into which second cells are inserted, which have the terminals for the shielding areas for contacting the interconnection of the shielding areas.

2. The transistor as recited in claim 1, wherein the shielding areas are situated directly below the trenches.

3. The transistor as recited in claim 1, wherein the shielding areas are embedded within the trench as the lowest layer and are insulated from the gate electrode by a first insulating layer.

4. The transistor as recited in claim 1, wherein the second cells themselves form a grid within the grid of the first cells.

5. The transistor as recited in claim 4, wherein at least one of: (i) the second cells, and (ii) the first cells, are designed to be triangular, rectangular, square, pentagonal, hexagonal, round or linear.

6. The transistor as recited in claim 1, wherein the second cells have a diode terminal that is short-circuited with the source, whereby an integrated diode connected in parallel is provided.

7. The transistor as recited in claim 6, wherein at least one of: (i) a number of the second cells is smaller than a number of the first cells, and (ii) a number of the terminals of the shielding areas is smaller than the number of the channel terminals.

8. The transistor as recited in claim 7, wherein the second cells have a greater surface area than the first cells.

9. The transistor as recited in claim 8, wherein a share of a surface area of the second cells is less than 30% of the a surface area of the transistor.

10. The transistor as recited in claim 8, wherein a share of a surface area of the second cells is less than 10% of the a surface area of the transistor.

11. The transistor as recited in claim 1, wherein the transistor is a trench MOSFET transistor.

* * * * *